(12) United States Patent
Kanematsu

(10) Patent No.: US 7,227,222 B2
(45) Date of Patent: Jun. 5, 2007

(54) SEMICONDUCTOR DEVICE AND MANUFACTURING METHOD THEREOF

(75) Inventor: Shigeru Kanematsu, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/221,802

(22) PCT Filed: Jan. 16, 2002

(86) PCT No.: PCT/JP02/00247

§ 371 (c)(1),
(2), (4) Date: Apr. 8, 2003

(87) PCT Pub. No.: WO02/056381

PCT Pub. Date: Jul. 18, 2002

(65) Prior Publication Data

US 2003/0151115 A1    Aug. 14, 2003

(30) Foreign Application Priority Data

Jan. 16, 2001    (JP) ............................. 2001-007519

(51) Int. Cl.
H01L 29/76 (2006.01)
H01L 29/94 (2006.01)
H01L 29/00 (2006.01)
H01L 31/11 (2006.01)

(52) U.S. Cl. ................... 257/328; 257/335; 257/531; 257/588; 336/300

(58) Field of Classification Search ............... 257/335, 257/328, 588, 531; 438/268; 336/200

See application file for complete search history.

(56) References Cited

U.S. PATENT DOCUMENTS

| | | | | |
|---|---|---|---|---|
| 5,268,309 A | * | 12/1993 | Mizutani et al. | ............... 438/59 |
| 5,578,860 A | * | 11/1996 | Costa et al. | ................. 257/528 |
| 6,225,182 B1 | | 5/2001 | Chu | |
| 6,236,101 B1 | * | 5/2001 | Erdeljac et al. | ............. 257/531 |
| 2001/0009795 A1 | | 7/2001 | Chu | |

FOREIGN PATENT DOCUMENTS

| | | |
|---|---|---|
| EP | 09-999579 | 5/2000 |
| JP | 52-116002 | 9/1977 |
| JP | 55-101066 | 7/1980 |
| JP | 05-264347 | 10/1992 |
| JP | 2000-150783 | 5/2000 |
| JP | 2001-89296 | 4/2001 |
| KR | 2000-035195 | 6/2000 |
| KR | 2001-030145 | 4/2001 |
| TW | 437085 | 5/2001 |

* cited by examiner

*Primary Examiner*—Douglas W. Owens
*Assistant Examiner*—Samuel A. Gebremariam
(74) *Attorney, Agent, or Firm*—Sonnenschein Nath & Rosenthal LLP (57) ABSTRACT

The present invention is related to a semiconductor device that forms an inductor on the same semiconductor substrate together with other active elements and a manufacturing method thereof. The semiconductor device of the present invention comprises a first conductivity type substrate, first semiconductor layer of a first conducting type with an impurity concentration lower than the substrate and a second semiconductor layer of a second conducting type on the first layer, an insulating film formed on this high-resistance semiconductor layer, and an inductor formed on this insulating film. The inductor has conducting film defining a width of the inductor. The first and second semiconductor layers are each formed under and at least as long as the width of the inductor.

5 Claims, 7 Drawing Sheets

SEMICONDUCTOR DEVICE AND MANUFACTURING METHOD THEREOF

BACKGROUND OF THE INVENTION

The present invention is related to a semiconductor device and manufacturing method thereof and in particular to a semiconductor device and manufacturing method thereof that forms an inductor on the same semiconductor substrate together with other active elements.

BACKGROUND ART

As a passive element, an inductor is normally formed by a so-called external attachment method that connects the inductor using a wire of a wire bond after forming an active element such as a transistor on a semiconductor substrate. If, however, we take into account the demands for compatibility with higher frequencies accompanying the ever increasing higher performance of integrated circuits, it has become impossible to ignore the inductance contained in the connecting wire. Consequently, in recent years methods have been employed to simultaneously form inductors on the same semiconductor substrates together with other active elements.

Figure 10A:
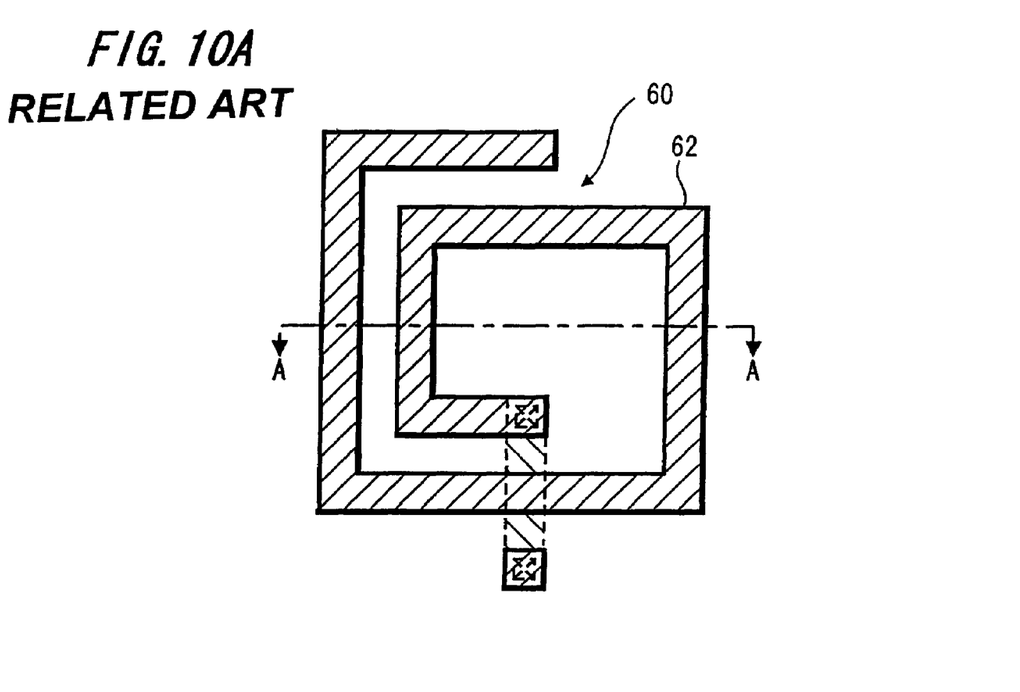
Figure 10B:
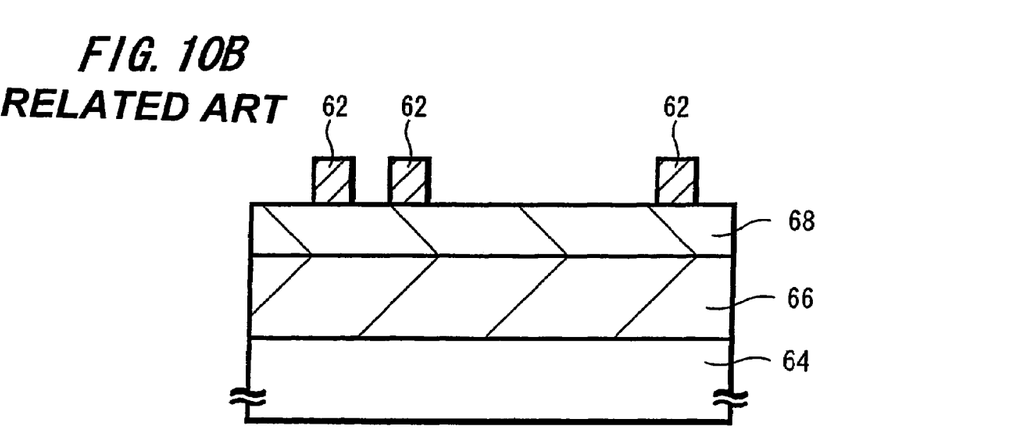
FIG. 10B is a sectional view thereof.

When forming inductors on the same semiconductor substrates together with other active elements, the compositions shown in FIGS. 10A and 10B are normally employed. Namely, the principal part of the inductor 60 is the spiral A1 wiring layer 62 formed in a spiral shape using a wire material with a low resistance such as A1. In order to reduce the parasitic capacitance between the inductor 60 and the semiconductor substrate 64, the spiral A1 wiring layer 62 is formed on the field oxidation film 66 that is formed on the semiconductor substrate 64 and the spiral A1 wiring layer 62 is also formed on the interlayer insulating film 68. In other words, the parasitic capacitance occurring between the semiconductor substrate 64 is reduced by means of placing the field oxidation film 66 and the interlayer insulating film 68 between the spiral A1 wiring layer 62 and the semiconductor substrate 64.

Even with this type of composition, however, since the semiconductor substrate 64, that has a certain amount of resistivity, exists under the spiral A1 wiring layer 62 via the field oxidation film 66 and the interlayer insulating film 68, an electrical current flows on the semiconductor substrate 64 side at high frequencies, incurring a situation in which it is impossible to ignore loss due to this current flow which is a factor in reducing the Q value that is one indicator of inductance characteristics. Even further, magnetic flux occurring in this inductor 60 causes an eddy current to occur in the semiconductor substrate 64 which also causes the inductance to drop. In other words, such a phenomenon hinders the element characteristics of the inductor 60 from improving and produces extreme disadvantages in the production of high-performance semiconductor integrated circuits.

Therefore, for inductors simultaneously formed on the same semiconductor substrates together with other active elements it has been difficult to obtain favorable element characteristics such as Q values compared to when forming inductors using an external attachment method after formation of other active elements and there were many disadvantages in the production of high-performance semiconductor integrated circuits.

Various measures have been considered from the past to counter the characteristic degradation such as this type of reductions in Q values of inductors. For example, reductions in the impurity concentration of the semiconductor substrate leading to high resistance has been considered. For this case, element characteristics such as the Q value are improved by reducing the current flowing in the semiconductor substrate and controlling the loss caused by that current. However, if the impurity concentration of the semiconductor substrate is simply reduced leading to high resistance, the electric potential of the semiconductor substrate will evenly drop and the semiconductor substrate of the integrated circuit will be very poor. Furthermore, when forming other elements such as bipolar transistors or MOS transistors on the same substrate, the problem of a latch-up phenomenon would occur due to this. Consequently, it is impossible to simply increase the resistance of a semiconductor substrate from the standpoint of integrated circuit reliability.

The use of an insulated substrate such SOI (Silicon On Insulator) has also been considered as a semiconductor substrate. This is a very effective method for eliminating the loss caused by current flowing in the semiconductor substrate. Unfortunately, manufacturing methods of integrated circuits using SOI are complicated and have problems related to cost.

There are also methods to reduce parasitic capacitance by means of increasing the thickness of the film of the interlayer insulating film between the inductor and the semiconductor substrate. For this case however, when the thickness of the film of the interlayer insulating film is thickened, electrodes with deep level differences must be formed while opening up apertures on the insulating film for other elements formed on the same substrate and forming electrodes which form a wiring layer for connecting to this element. Because of this, the shape of the wiring layer embedded on that electrode portion becomes very poor leading to the possibility of problems such as poor contact.

DISCLOSURE OF THE INVENTIONS

The present invention is implemented in view of the above-mentioned circumstances and its object is, in a semiconductor device for simultaneously forming inductors on the same semiconductor substrate together with other active elements and a manufacturing method thereof, to provide a semiconductor device equipped with favorable element characteristics as prevents reductions in Q values and inductance accompanying loss caused by the flow of electrical current on the semiconductor substrate side and a manufacturing method of a semiconductor device that can produce inductors which have this type of favorable element characteristics.

As a method for reducing the parasitic capacitance that parasitize between the inductor and semiconductor substrate, putting in place a high resistance layer between the interlayer insulating film, field oxidation film under the inductor and the semiconductor substrate has also been considered. For this method, even at high frequencies not only is the current flowing in the high-resistance layer and semiconductor substrate is reduced thereby controlling loss caused by this current, which in turn improves the element characteristics such as Q values, problems of integrated circuit reliability when increasing the resistance of the semiconductor substrate itself and poor contact when thickening the interlayer insulating film.

Thereupon, a high-resistance layer is put in place between the interlayer insulating film, field oxidation film under the inductor and the semiconductor substrate as a measure to obtain favorable element characteristics such as Q values of inductors when simultaneously forming an inductor on the same semiconductor substrate together with other active elements. The processes to form this high-resistance layer, however, are prepared as specialized and dedicated processes to form inductors and as such lead to reduced productivity and increased cost accompanying an increased number of processes. Then, it is conceivable that this high-resistance layer doubles as an n type epitaxial layer that forms an n type collector region of an ordinary NPN bipolar transistor. For this case, however, if the resistance of this n type epitaxial layer is increased to a high resistance, drawbacks in the bipolar transistor characteristics will occur such as reduced breakdown voltage between the collector—emitter junction of the NPN bipolar transistor. Consequently, this is not recommended.

Further, in order to reduce the parasitic capacitance, the inductor is formed on a field oxidation film although the n type epitaxial layer that forms the collector region is oxidized while forming the field oxidation film under the inductor, which leads to the film thickness of the n type epitaxial layer under the field oxidation film inevitably growing thinner. As a result, there are more chances that the magnetic flux occurring in the inductor will pass through a thin n type epitaxial layer, increasing the impurity concentration and finally reaching the semiconductor substrate with a low resistivity. This leads to reduced inductance due to the generation of the eddy current described above. As a countermeasure against this, simply forming a thick n type epitaxial layer has been considered. For this measure, however, increases in the collector resistance of the NPN bipolar transistor and worsening frequency characteristics occur and, after all this is not recommended to increase the performance of integrated circuits.

Consequently, it is difficult to use a high-resistance layer disposed between the interlayer insulating film and field oxidation film under the inductor and the semiconductor substrate as an n type epitaxial layer that forms an n type collector region of an NPN bipolar transistor for the purpose of decreasing the number of processes. Therefore, even if placing a high-resistance layer between the interlayer insulating film, field oxidation film under the inductor and the semiconductor substrate is ideal in order to obtain favorable device characteristics such as Q values for inductors simultaneously formed on the same semiconductor substrates together with other active elements, forming that high-resistance layer still remains a problem.

Methods to solve this problem are as follows.

The semiconductor device related to the present invention is characterized by comprising a substrate (semiconductor substrate), a semiconductor layer (high resistance semiconductor layer) formed on this substrate that has an impurity concentration lower than the impurity concentration of the substrate, an insulating film formed on this semiconductor layer, and an inductor formed on this insulating film.

The inductor is preferably formed of a conducting film formed in a spiral shape. The substrate can be a first conducting type and the semiconductor layer can be a first conducting type. The thickness of the semiconductor layer is preferably between 5 to 15 µm.

The impurity concentration of the substrate layer is preferably between $1\times10^{13}$ to $1\times10^{14}$ cm$^{-3}$.

The semiconductor device related to the present invention is characterized in that the substrate is a first conducting type (or first conductivity type) and the semiconductor layer is formed on a first conducting type first semiconductor layer. A second conducting type (or second conductivity type) second semiconductor layer is also formed between the insulating film and the first semiconductor layer.

The thickness of the first semiconductor layer is preferably thicker than the thickness of the second semiconductor layer. For example, it can be between 5 to 15 µm. The impurity concentration of the first semiconductor layer is preferably between $1\times10^{13}$ to $1\times10^{14}$ cm$^{-3}$ and the impurity concentration of the second semiconductor layer is preferably between $1\times10^{15}$ to $1\times10^{16}$ cm$^{-3}$.

In each of the above-mentioned semiconductor devices the semiconductor device related to the present invention is characterized in that a bipolar transistor and a photo diode are formed on the same substrate.

Hereupon, in the semiconductor device that has a first semiconductor layer and a second semiconductor layer, it is preferable for the first semiconductor layer to be comprised of an anode or a cathode of a photo diode and the second semiconductor layer to be comprised of an anode or a cathode of a photo diode. Namely, when the first semiconductor layer is comprised of an anode of a photo diode, the second semiconductor layer will be comprised of a cathode of a photo diode. Conversely, when the first semiconductor layer is comprised of a cathode of a photo diode, the second semiconductor layer will be comprised of an anode of a photo diode. In addition, it is preferable for the second semiconductor layer to be comprised of a collector of a bipolar transistor. In each of the above-mentioned semiconductor devices, it is preferable for a region with an impurity concentration higher than the high-resistance semiconductor layer (semiconductor layer or first semiconductor layer) to be formed under regions which do not correspond to the regions where an inductor is formed.

The manufacturing method of a semiconductor device related to the present invention is characterized by including a process that forms a semiconductor layer (high-resistance semiconductor layer) with an impurity concentration lower than the substrate (semiconductor substrate) whereon it is formed, a process that forms an insulating film on this semiconductor layer, a process that forms a conducting film on this insulating film and a process that patterns this conducting film in a spiral shape to form an inductor.

In like manner to the above, the substrate can be a first conducting type and the semiconductor layer can be first conducting type. The thickness of the semiconductor layer is preferably between 5 to 15 µm. The impurity concentration of the semiconductor layer is preferably between $1\times10^{13}$ to $1\times10^{14}$ cm$^{-3}$.

The manufacturing method of a semiconductor device related to the present invention is characterized in that the above-mentioned manufacturing method of a semiconductor device has a process that forms a semiconductor layer on the first conducting type first semiconductor layer and then between the process to form this first semiconductor layer and the process to form the insulating film successively forms a second conducting type second semiconductor layer on the first semiconductor layer.

In like manner to the above, the thickness of the first semiconductor layer is preferably thicker than the thickness of the second semiconductor layer. For example, between 5 to 15 µm. The impurity concentration of the first semiconductor layer is preferably between $1\times10^{13}$ to $1\times10^{14}$ cm$^{-3}$ and the impurity concentration of the second semiconductor layer is preferably between $1\times10^{15}$ to $1\times10^{16}$ cm$^{-3}$.

The manufacturing method of a semiconductor device related to the present invention is characterized in that each of the above-mentioned manufacturing methods of a semiconductor device has a process to form a bipolar transistor and photo diode on the same substrate.

Hereupon, in like manner to the above, in the manufacturing method of a semiconductor device that has a first semiconductor layer and a second semiconductor layer, it is preferable for the first semiconductor layer to be comprised of the anode or cathode of the photo diode and the second semiconductor layer to be comprised of the cathode or anode of the photo diode. Moreover, it is preferable for the second semiconductor layer to be formed so it functions as the collector of the bipolar transistor. In the above-mentioned manufacturing methods of a semiconductor device, it is preferable to have a process that forms a region with an impurity concentration higher than the high-resistance semiconductor layer (semiconductor layer or first semiconductor layer) under regions which do not correspond to the regions where the inductor is formed.

According to the semiconductor device related to the present invention, a composition is obtained wherein a semiconductor layer with a low impurity concentration, namely a high-resistance semiconductor layer, is disposed between the insulating film under the inductor and the substrate by means of providing a substrate, a semiconductor layer formed on the substrate that has an impurity concentration lower than the substrate, an insulating film formed on the semiconductor layer, and an inductor formed on the insulating film. Because of this, even at high frequencies current flowing in the high-resistance semiconductor layer and substrate is reduced thereby making it possible to control loss caused by this current. Consequently, a high performance inductor with favorable device characteristics that has a Q value and inductance higher than a conventional inductor can be obtained which also makes it possible to obtain semiconductor integrated circuits with even more features and higher performance. Further, since the resistance of the semiconductor substrate itself is not increased nor is the thickness of the insulating film between the inductor and substrate made thicker, the necessity of being concerned about problems such as the reliability of semiconductor integrated circuits whereon other active elements are formed together with the inductors as well as problems of poor contact is eliminated.

According to the semiconductor device related to the present invention, in the semiconductor devices mentioned above, when the substrate is a first conducting type, the semiconductor layer forms on the first conducting type first semiconductor layer and the second conducting type second semiconductor layer forms between the insulating film and the first semiconductor layer, a composition is obtained wherein a pn junction formed on the first conducting type first semiconductor layer (high-resistance semiconductor layer) and the second conducting type second semiconductor layer is between the insulating film under the inductor and the substrate. Because of this, in addition to a capacitance formed from the insulating film, a comparatively small pn junction capacitance is added in series by the first conducting type first semiconductor layer (high-resistance semiconductor layer) and the second conducting type second semiconductor layer between the inductor and the substrate, making it possible to greatly reduce the overall parasitic capacitance more compared to a conventional case. Consequently, a high performance inductor with favorable device characteristics that has a Q value and inductance higher than a conventional inductor can be obtained which also makes it possible to obtain semiconductor integrated circuits with even more features and higher performance. Further, since the resistance of the semiconductor substrate itself is not increased nor is the thickness of the insulating film between the inductor and substrate made thicker, the necessity of being concerned about problems such as the reliability of semiconductor integrated circuits whereon other active elements are formed together with the inductors as well as problems of poor contact is eliminated.

In the above-mentioned semiconductor devices, by means of providing a composition with the photo diode and the bipolar transistor formed on the same semiconductor substrate it is also possible to obtain semiconductor integrated circuits with even more features and higher performance which have the inductor, the bipolar transistor and the photo diode mounted. Photo diodes are widely used in, for example, photo sensors which convert optical signals to electrical signals in various types of photoelectric conversion devices.

When the first semiconductor layer is comprised as a cathode or an anode of a photo diode and the second semiconductor layer is comprised as a cathode or an anode of a photo diode, the first conducting type first semiconductor layer (high-resistance semiconductor layer) is also used as a p type semiconductor layer or an n type semiconductor layer which form an anode of a PN photo diode and the second conducting type second semiconductor layer is also used as an n type semiconductor layer or a p type semiconductor layer which form a cathode of a PN photo diode. Because of this, it becomes unnecessary to increase specialized and dedicated processes to form inductors. Therefore, a high performance inductor with favorable device characteristics that has a high Q value and high inductance can be realized without any reductions in productivity or increases in cost occurring, which also makes it possible to obtain semiconductor integrated circuits with even more features and higher performance.

When the second semiconductor layer is comprised as a collector of a bipolar transistor, the second semiconductor layer is also used as a semiconductor layer that forms the collector of a bipolar transistor. Because of this, it becomes unnecessary to increase specialized and dedicated processes to form inductors. Therefore, a high performance inductor with favorable device characteristics that has a high Q value and high inductance can be realized without any reductions in productivity or increases in cost occurring, which also makes it possible to obtain semiconductor integrated circuits with even more features and higher performance.

When forming a region of a first conducting type with an impurity concentration higher than the high-resistance semiconductor layer (semiconductor layer, first semiconductor layer) under regions which do not correspond to the regions where the inductor is formed in a semiconductor device in which the inductor, bipolar transistor and photo diode are formed on the same substrate, highly reliable semiconductor integrated circuits can be obtained in which the problem of a latch-up phenomenon is difficult to appear.

According to the manufacturing method of the semiconductor device related to the present invention, it is easy to form a composition wherein a semiconductor layer with a low impurity concentration, namely a high-resistance semiconductor layer, is disposed between the insulating film under the inductor and the substrate by means of forming a semiconductor layer with an impurity concentration lower than the substrate whereon it is formed, forming an insulating film on this semiconductor layer, forming a conducting film on this insulating film, and then patterning this conducting film into a spiral shape to form an inductor. Because of this, even at high frequencies current flowing in the high-resistance semiconductor layer and substrate is reduced, thereby making it possible to control loss caused by this current. Consequently, a high performance inductor with favorable device characteristics that has a Q value and inductance higher than a conventional inductor can be obtained, which also makes it possible to obtain semiconductor integrated circuits with even more features and higher performance. Further, since the resistance of the substrate itself is not increased nor is the thickness of the insulating film between the inductor and substrate made thicker, the necessity of being concerned about problems such as the reliability of semiconductor integrated circuits whereon other active elements are formed together with the inductors as well as problems of poor contact is eliminated.

According to the manufacturing method of the semiconductor device related to the present invention, in the manufacturing methods of the semiconductor device, a semiconductor layer is formed of the first conducting type first semiconductor layer, and when there is a process that successively forms the second conducting type second semiconductor layer on the first semiconductor layer between the process that forms the first semiconductor layer and the process to form the insulating film, it is easy to form a composition wherein a pn junction formed on the first conducting type first semiconductor layer (high-resistance semiconductor layer) and the second conducting type second semiconductor layer is between the insulating film under the inductor and the substrate. Because of this, between the inductor and the substrate, a comparatively small pn junction capacitance is added in series by the first conducting type first semiconductor layer (high-resistance semiconductor layer) and the second conducting type second semiconductor layer in addition to a capacitance formed from the insulating film, thereby making it possible to greatly reduce the overall parasitic capacitance more compared to a conventional case. Consequently, a high performance inductor with favorable device characteristics that has a Q value and inductance higher than a conventional inductor can be obtained which also makes it possible to obtain semiconductor integrated circuits with even more features and higher performance. Further, since the resistance of the semiconductor substrate itself is not increased nor is the thickness of the insulating film between the inductor and substrate made thicker, the necessity of being concerned about problems such as the reliability of semiconductor integrated circuits whereon other active elements are formed together with the inductors as well as problems of poor contact is eliminated.

In the above-mentioned manufacturing methods of the semiconductor device, by means of having a process that forms the bipolar transistor and photo diode on the same substrate, it is possible to produce semiconductor integrated circuits with even more features and higher performance which have the inductor, the bipolar transistor and the photo diode mounted. Photo diodes are widely used in, for example, photo sensors which convert optical signals to electrical signals in various types of photoelectric conversion devices.

When the first conducting type first semiconductor layer is comprised as an anode or a cathode of a photo diode and the conducting type second semiconductor layer is comprised as an anode or a cathode of a photo diode, the first semiconductor layer is formed between the insulating film under the inductor and the substrate simultaneous with the formation of a p type semiconductor layer that forms the anode or an n type semiconductor layer that forms the cathode of a PN photo diode. Even further, an n type semiconductor layer that forms the cathode and a p type semiconductor layer that forms the anode of a PN photo diode are simultaneously formed with the second semiconductor layer. Because of this, it becomes unnecessary to increase specialized and dedicated processes to form inductors. Therefore, a high performance inductor with favorable device characteristics that has a high Q value and high inductance can be realized without any reductions in productivity or increases in cost occurring, which also makes it possible to obtain semiconductor integrated circuits with even more features and higher performance.

When the second semiconductor layer is formed to function as a collector of a bipolar transistor, the second semiconductor layer forms between the insulating film under the inductor and the substrate simultaneous with the semiconductor layer that forms the collector region of the bipolar transistor. Because of this, it becomes unnecessary to increase specialized and dedicated processes to form inductors. Therefore, a high performance inductor with favorable device characteristics that has a high Q value and high inductance can be realized without any reductions in productivity or increases in cost occurring which also makes it possible to obtain semiconductor integrated circuits with even more features and higher performance.

In the manufacturing method of the semiconductor device that forms the above-mentioned inductor, bipolar transistor and photo diode on the same substrate, when there is a process that forms a region of a first conducting type with an impurity concentration higher than the high-resistance semiconductor layer (semiconductor layer, first semiconductor layer) under regions which do not correspond to the regions where the inductor is formed, highly reliable semiconductor integrated circuits can be obtained in which the problem of a latch-up phenomenon is difficult to appear.

BRIEF DESCRIPTION OF THE DRAWINGS

FIG. 5 is a cross sectional view of a process (5) for explaining a manufacturing method of a semiconductor integrated circuit in which an inductor is mixedly loaded on the same semiconductor substrate together with a photodiode and a bipolar transistor according to an embodiment of the present invention.

FIG. 8A is a plan view of the inductor which was completed through the processes shown in FIG. 1 to FIG. 7, respectively while

FIG. 9A is a plan view showing a modified example of the inductor shown in FIG. 8A while

FIG. 10A is a plan view of a conventional inductor while

DETAILED DESCRIPTION OF THE PRESENTLY PREFERRED EMBODIMENTS

In the following, embodiments of the present invention will be described referring to the drawings.

Figure 8A:
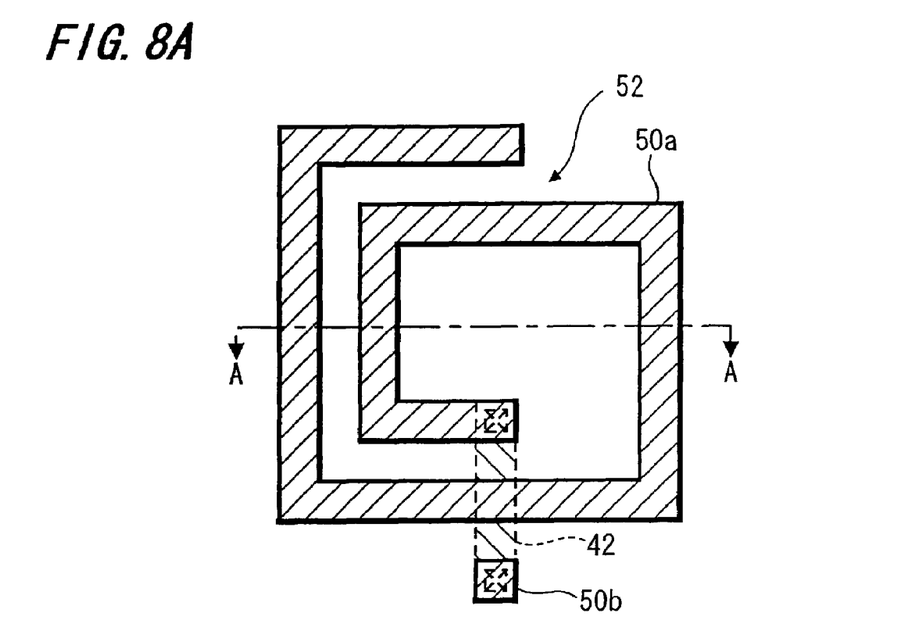
Figure 8B:
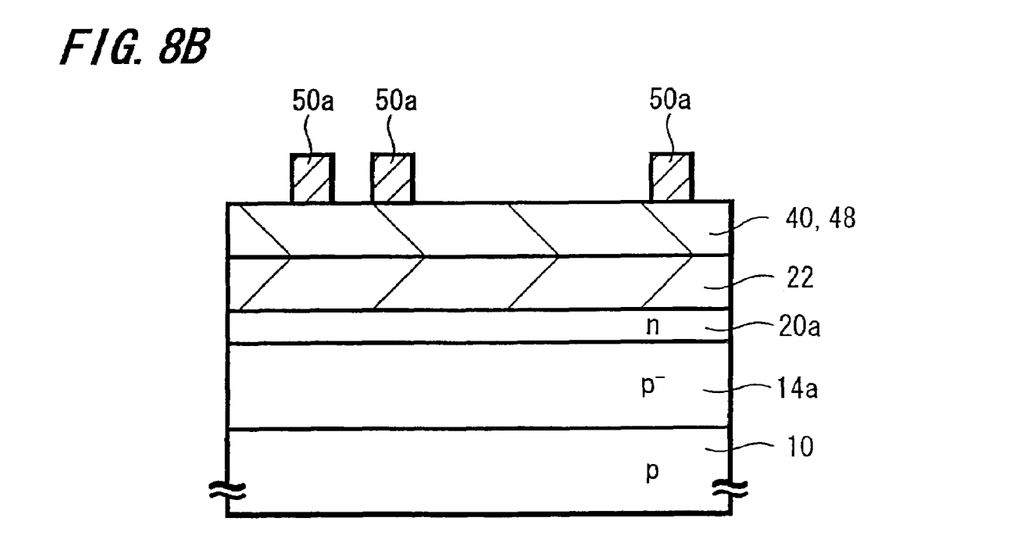
FIG. 8B is a sectional view thereof along A-A line.
Figure 9A:
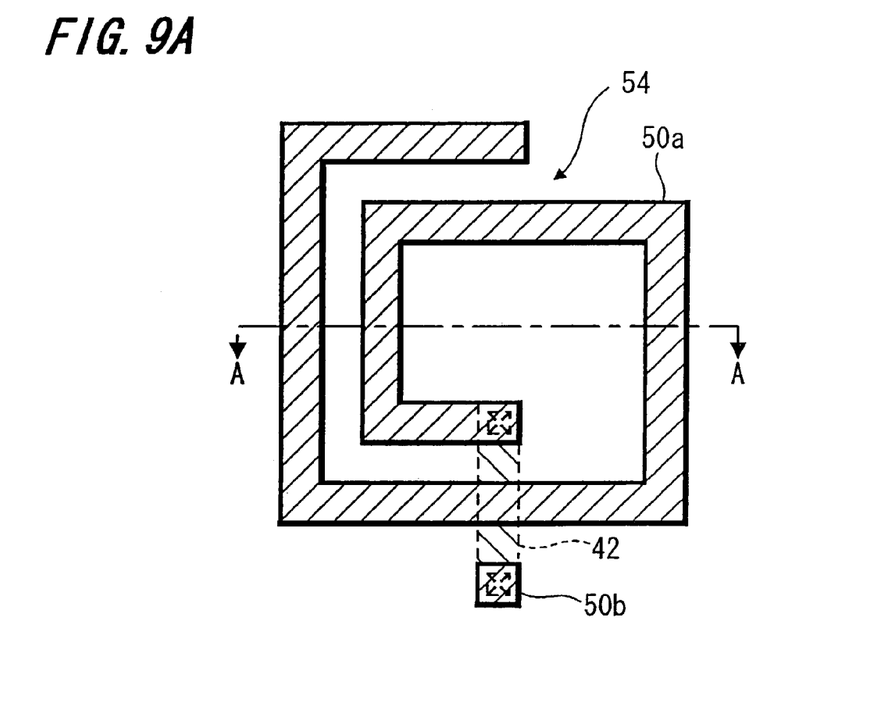
Figure 9B:
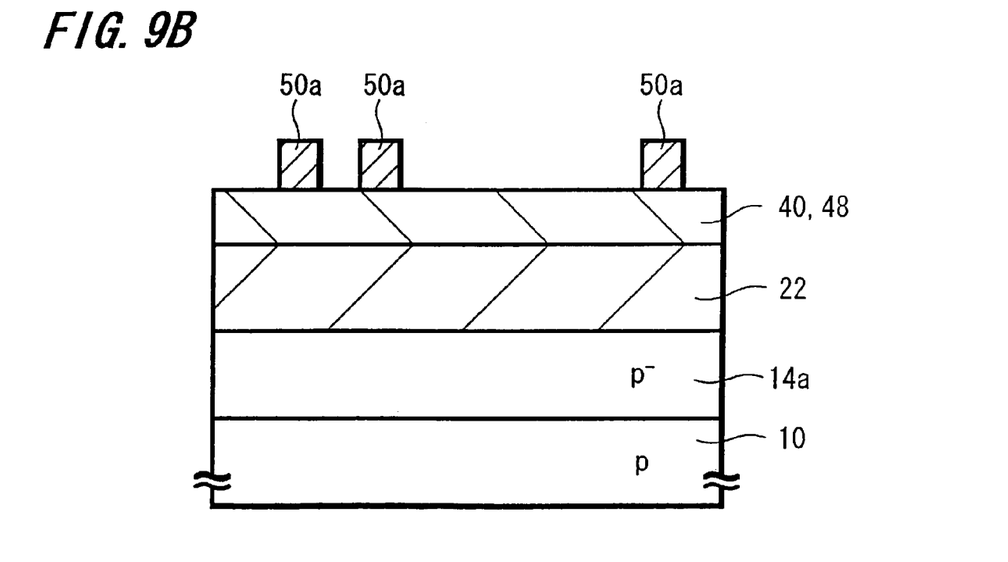
FIG. 9B is a sectional view showing a modified example thereof along A-A line.

FIG. 1~FIG. 7 are cross sectional views of processes which serve to describe the semiconductor device and manufacturing method thereof wherein an inductor is mixedly mounted onto the same semiconductor substrate together with a photodiode and bipolar transistor. FIGS. 8A and 8B are plan views and cross sections along A-A line that show an inductor completed through the processes shown in FIG. 1~FIG. 7. FIGS. 9A and 9B are cross sections that show a modified example of the inductor shown in FIGS. 8A and 8B.

In each of the cross sectional views of the processes in FIG. 1~FIG. 7, the regions where each of the devices, the inductor, the photodiode and the bipolar transistor, are formed on the semiconductor substrate will be described as inductor formation region A, photodiode formation region B and bipolar transistor formation region C, respectively.

At first, a photo resist patterned by ordinary photolithography technology is made into a mask after forming a thin thermally-oxidized film on the surface of p type semiconductor substrate 10 with an impurity concentration of approximately $1 \times 10^{15}$ cm$^{-3}$. Then, using ordinary implantation technology p type impurities, such as Boron (B), are selectively ion implanted onto the entire region of inductor formation region A under conditions of an acceleration voltage of 30 KeV and a doping amount of $1 \times 10^{15}$ cm$^{-2}$. Continuing, a high concentration of p type impurity ions implanted on the surface of the p type semiconductor substrate 10 are activated by a thermal process with a temperature of 1200° C. for approximately 1 hour and diffused on the surface of the p type semiconductor substrate 10 to form the high density p+ type semiconductor region 12 with a peak concentration of approximately $1 \times 10^{13}$ cm$^{-3}$. Thereafter, the entire surface of the above-mentioned thin thermally-oxidized film is separated using hydrofluoric acid (HF). (Refer to FIG. 1.)

Next, a low density p-type epitaxial layer 14 with a film thickness of approximately 10 μm and an impurity concentration of approximately $2 \times 10^{14}$ cm$^{-3}$ is formed on the p type semiconductor substrate 10 and the p+ type semiconductor region 12. This p-type epitaxial layer 14 is a layer formation region forming an anode of the photo diode later. (Refer to FIG. 2.)

Next, a photo resist patterned by ordinary photolithography technology is made into a mask after forming a thin thermally-oxidized film on the surface of the p-type epitaxial layer 14. Then, using ordinary implantation technology p type impurities, such as Boron, are selectively ion implanted onto the entire region of the p-type epitaxial layer 14 except for the inductor formation region A and the photo diode formation region B under conditions of an acceleration voltage of 500 KeV and a doping amount of $1 \times 10^{12}$ cm$^{-2}$. Continuing, a low concentration of p type impurity ions implanted onto the p-type epitaxial layer 14, such as the bipolar transistor formation region C, are activated by a thermal process with a temperature of 1200° C. for approximately 1 hour and diffused to form the low density p type well layer 16 with an impurity concentration of approximately $1 \times 10^{15}$ cm$^{-3}$ near the surface. Thereafter, the entire surface of the above-mentioned thin thermally-oxidized film is separated using hydrofluoric acid. At this time the impurities close to the surface of the p type well layer 16 correspond to the substrate concentration of the bipolar transistor. Therefore, it becomes possible to match the characteristics to the bipolar transistor formed on the bipolar transistor formation region C (Refer to FIG. 3.)

Next, antimony (n type impurity) is selectively added onto the surface of the p type well layer 16 of the bipolar transistor formation region C by gas vapor diffusion of antimony (Sb) under conditions of, for example, a temperature of 1100~1250° C. for approximately 30~60 minutes to form a high density n+ type embedded layer 18 to reduce the collector parasitic capacitance. In addition, the thermal diffusion process that forms the p type well layer 16 in the process shown in FIG. 3 above can also be used as the thermal diffusion process that forms this n+ type embedded layer 18 and the number of times the thermal diffusion process executes can also be reduced. Continuing, an n type epitaxial layer 20 with a film thickness of 1 μm and an impurity concentration of approximately $5 \times 10^{15}$ cm$^{-3}$ forms on the entire base substance, namely, the p– type epitaxial layer 14, the p type well layer 16 and the n+ type embedded layer 18 following an ordinary bipolar transistor process. (Refer to FIG. 4.)

Next, a field oxidation film 22 approximately 400~1500 nm thick selectively forms on the separation portion between the elements (field portion) of the inductor formation region A, the photo diode formation region B and the bipolar transistor formation region C using a LOCOS (Local Oxidation of Silicon: selective oxidation) method. In other words, after forming a layered film comprising an Si oxidation film and an Si nitride film on the normally used n type epitaxial layer 20 and then selectively etching away this layered film using an R1E method that forms a photo resist patterned by photolithography technology into a mask and only exposing the region where the field oxidation film 22 will be formed, the exposed n type epitaxial layer 20 is selectively oxidized using the Si nitride film of the layered film as a mask to form the field oxidation film 22. At this time, there is a method to remove one part of all of the exposed n type epitaxial layer 20 before forming the field oxidation film 22. For this case, if we consider merging the portions of the n type epitaxial layer 20 oxidized by the continuously executing selective oxidation, there is a possibility that none of the n type epitaxial layer 20 will remain on the inductor formation region A. The present invention, however, has no restrictions as far as that is concerned. Hereupon, a case in which the n type epitaxial layer 20 remains between the p− type epitaxial layer 14 and the p type well layer 16 and field oxidation film 22 is shown. (Refer to FIG. 5.)

Continuing, together with the n+ type collector DERIVING region 24, that connects to the p+ type embedded layer of the bipolar transistor formation region C, forming and the p+ type anode DERIVING region 26, that connects to the p− type epitaxial layer 14 of the photo diode formation region B, forming following with the manufacturing process of a bipolar transistor and photo diode, the p+ type element isolation region 28 forms under the field oxidation film 22 and separation of the photo diode formation region B and the bipolar transistor formation region C occurs. Further, accompanying this element separation, hereinafter, the n type epitaxial layer 20 under the field oxidation film 22 of the inductor formation region A is referred to as the n type semiconductor layer 20a, the n type epitaxial layer 20 of the photo diode formation region B is referred to as the n type cathode layer 20b and the n type epitaxial layer 20 of the bipolar transistor formation region C is referred to as the n type collector layer 20c. Furthermore, the p− type epitaxial layer 14 under the field oxidation film 22 of the inductor formation region A is referred to as the p− type high-resistance semiconductor layer and the p− type epitaxial layer 14 under the n type cathode layer 20b of the photo diode formation region B is referred to as the p− type anode layer 14b. Continuing, together with n+ type anode DERIVING region 30 forming on the surface of the n type cathode layer 20b of the photo diode formation region B, the p type base region 32 forms on the n type collector layer 20c of the bipolar transistor formation region C and the p+ type base DERIVING region forms on this p type base region 32. After forming the emitter DERIVING electrode 36, comprised of a polysilicon to which n type impurities are added, on the p type base region 32 of the bipolar transistor formation region C, the n+ type emitter region 38 forms on the p type base region 32 by means of impurity diffusion from this emitter DERIVING electrode 36. Continuing, after forming the first layer insulating film 40, comprised of, for example, Si oxidized film, on the entire base substance, collector holes form at specified locations on the photo diode formation region B and the bipolar transistor formation region C using photolithography and etching technologies. Then, after depositing the A1 film on the entire base substance and embedding each contact hole, this A1 film undergoes patterning processing using photolithography and R1E technologies. Thus, in the inductor formation region A, the leader A1 wiring layer 42, that functions to extract the inductor terminal (formed later) from the inside, forms on that first layer insulating film 40. In like manner, in the photo diode formation region B, the anode A1 electrode 42a, that connects to the p+ type anode DERIVING region 26, forms and the cathode A1 electrode 42b, that connects to the n+ type anode DERIVING region 30, forms. Moreover, in the bipolar transistor formation region C, the emitter A1 electrode 42E that connects to the n+ type emitter region 38 through the emitter DERIVING electrode 36 forms, the base A1 electrode 42B that connects to the p+ type base DERIVING region 34 forms, and the collector A1 electrode 42C that connects to the n+ type collector DERIVING region forms. Thus, the PN photo diode 44 is completed in the photo diode formation region B and the NPN bipolar transistor 46 is completed in the bipolar transistor formation region C. (Refer to FIG. 6.)

Figure 1:
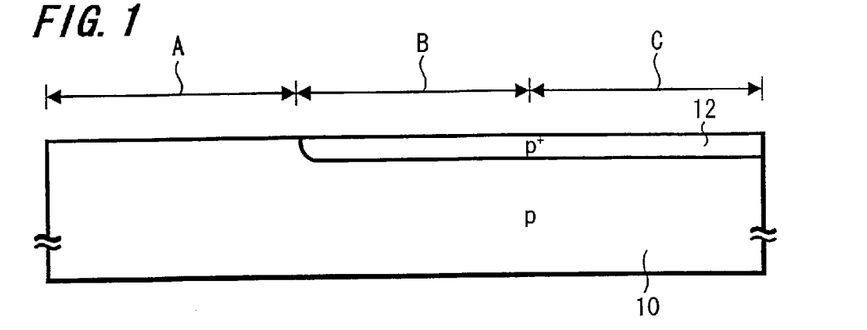
FIG. 1 is a cross sectional view of a process (1) for explaining a manufacturing method of a semiconductor integrated circuit in which an inductor is mixedly loaded on the same semiconductor substrate together with a photo-diode and a bipolar transistor according to an embodiment of the present invention.
Figure 2:
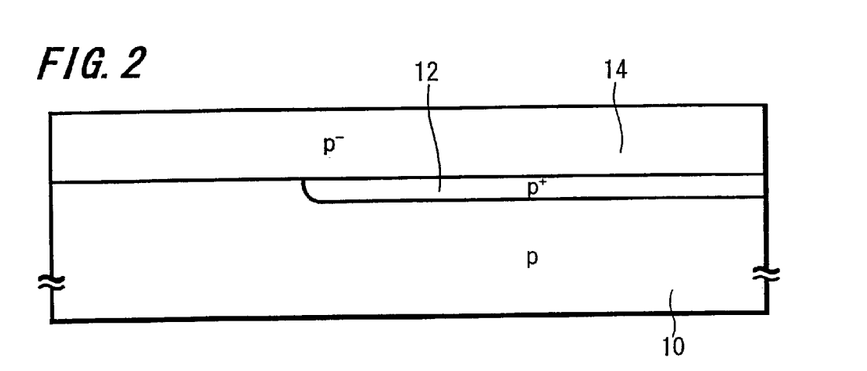
FIG. 2 is a cross sectional view of a process (2) for explaining a manufacturing method of a semiconductor integrated circuit in which an inductor is mixedly loaded on the same semiconductor substrate together with a photo-diode and a bipolar transistor according to an embodiment of the present invention.
Figure 3:
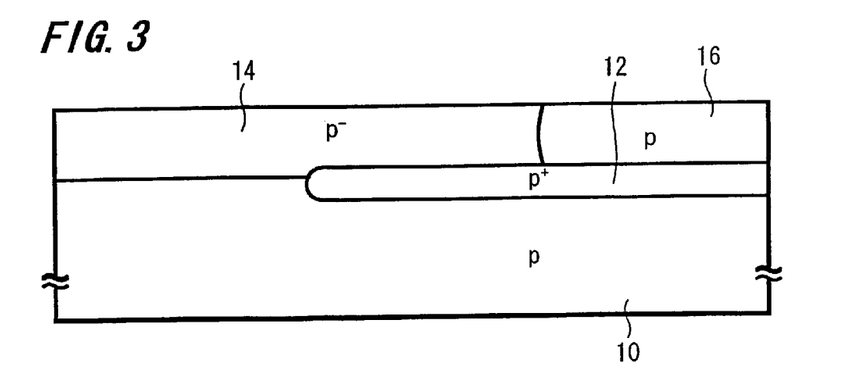
FIG. 3 is a cross sectional view of a process (3) for explaining a manufacturing method of a semiconductor integrated circuit in which an inductor is mixedly loaded on the same semiconductor substrate together with a photo-diode and a bipolar transistor according to an embodiment of the present invention.
Figure 4:
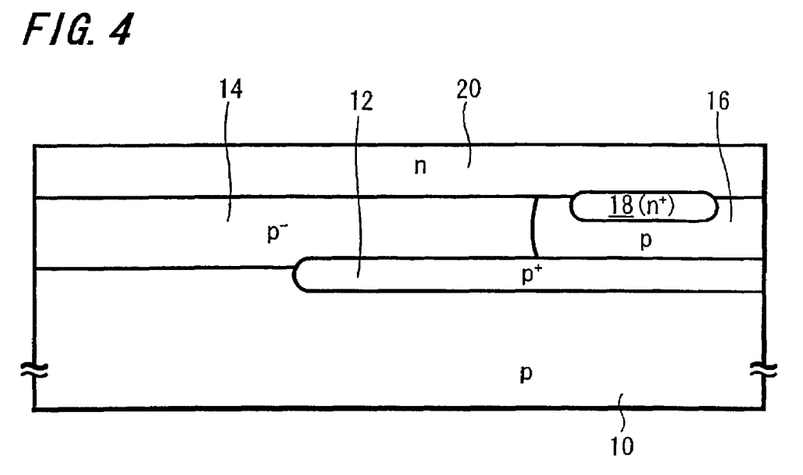
FIG. 4 is a cross sectional view of a process (4) for explaining a manufacturing method of a semiconductor integrated circuit in which an inductor is mixedly loaded on the same semiconductor substrate together with a photo-diode and a bipolar transistor according to an embodiment of the present invention.
Figure 5:
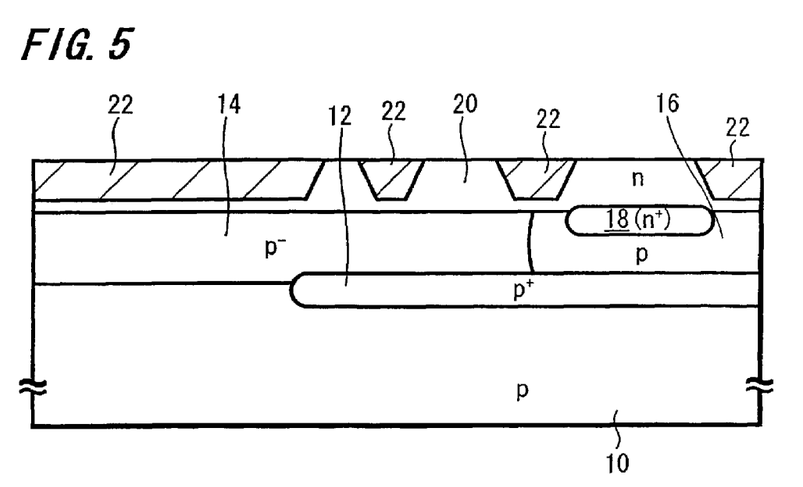
FIG. 5 is a cross sectional view of a process (5) for explaining a manufacturing method of a semiconductor integrated circuit in which an inductor is mixedly loaded on the same semiconductor substrate together with a photo-diode and a bipolar transistor according to an embodiment of the present invention.
Figure 6:
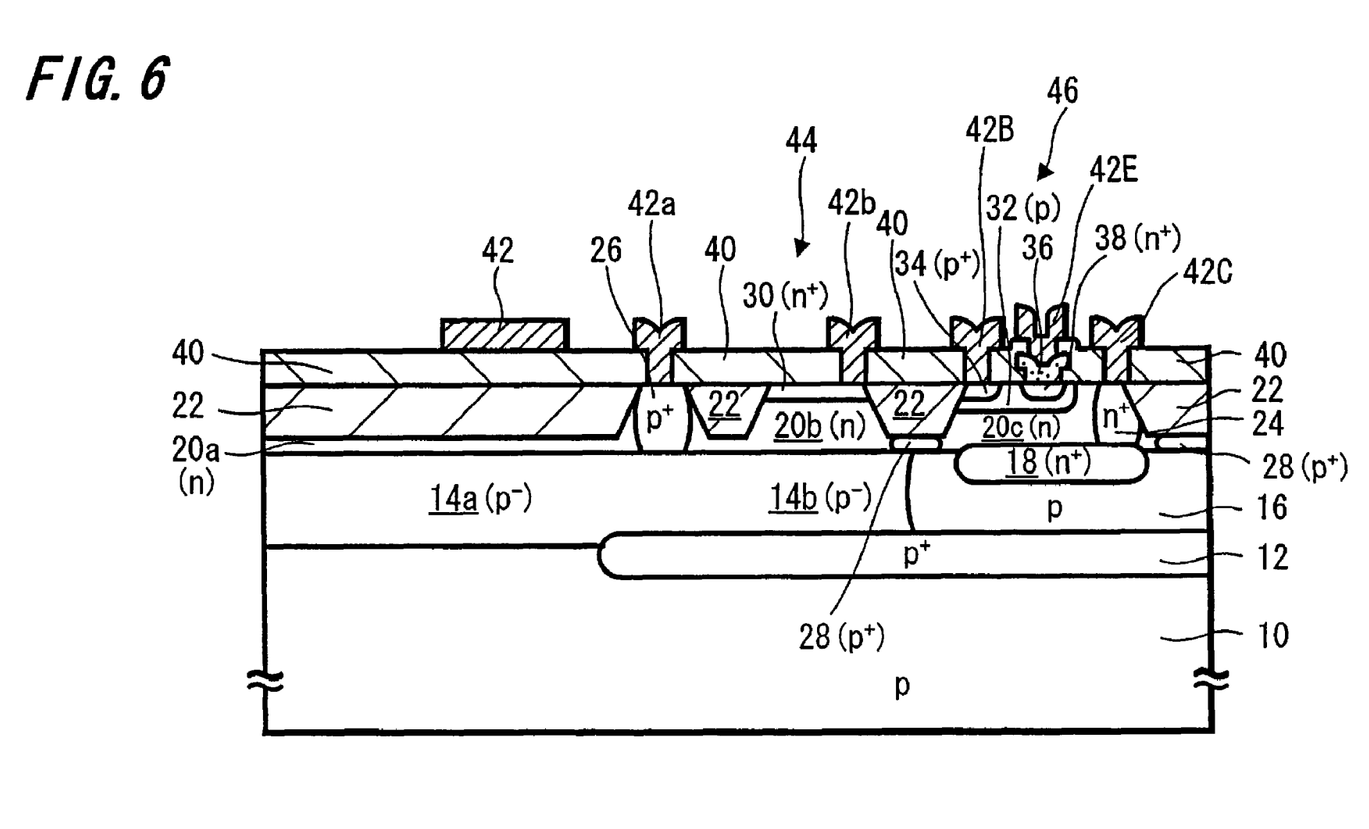
FIG. 6 is a cross sectional view of a process (6) for explaining a manufacturing method of a semiconductor integrated circuit in which an inductor is mixedly loaded on the same semiconductor substrate together with a photodiode and a bipolar transistor according to an embodiment of the present invention.
Figure 7:
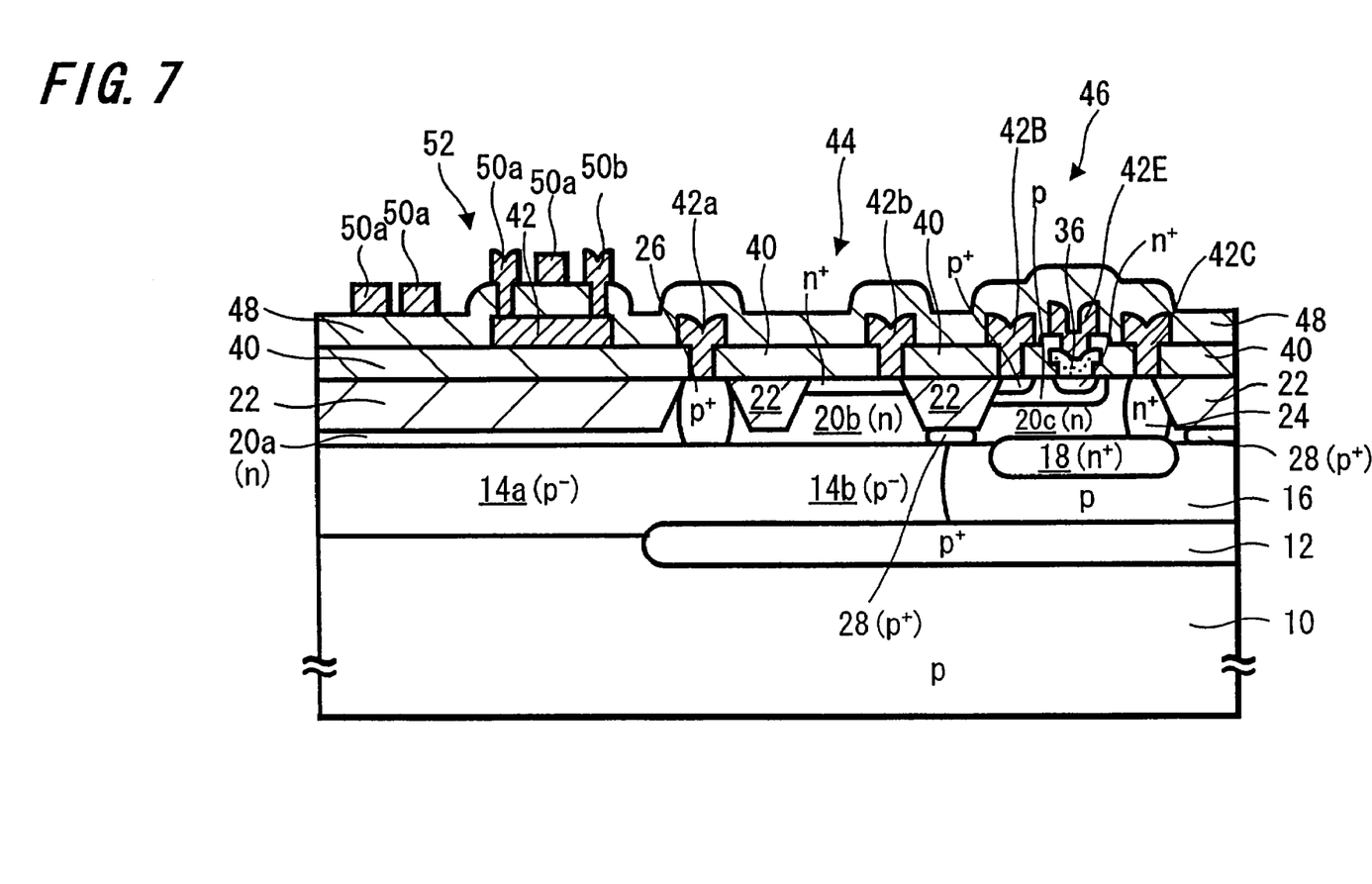
FIG. 7 is a cross sectional view of a process (7) for explaining a manufacturing method of a semiconductor integrated circuit in which an inductor is mixedly loaded on the same semiconductor substrate together with a photodiode and a bipolar transistor according to an embodiment of the present invention.

Although examples of manufacturing processes which are fundamentally already known were described for the processes to form the PN photo diode 44 and the NPN bipolar transistor 46, as long as the formation process of the p− type epitaxial layer 14 to form the p− type high-resistance semiconductor layer 14a of the inductor formation region A and the p− type anode layer 14b of the PN photo diode 44 is used as well as the formation process of the n type epitaxial layer 20 to form the n type semiconductor device 20a of the inductor formation region A, the n type cathode layer 20b of the PN photo diode 44 and the n type collector layer 20c of the NPN bipolar transistor 46 is used, the present invention is not limited to these even if some different methods are used to form other compositional elements. Furthermore, the leader A1 wiring layer 42 in the inductor formation region A is formed simultaneously in the same process at the formation processes of the anode A1 electrode 42a and the cathode A1 electrode 42b of the PN photo diode 44, the emitter A1 electrode 42E, the base A1 electrode 42B and the collector A1 electrode 42C of the NPN bipolar transistor 46. There are no problems even if separate formations occur in separate processes. When forming this leader A1 wiring layer 42, simultaneously forming an A1 layer for connecting other elements in regions outside the inductor formation region naturally becomes possible.

Next, after forming the second interlayer insulating film 48, comprised of an Si oxidized film, on the entire base substance using, for example, a p (plasma) TEOS [tetraethoxy silane; $Si(OC_2H_5)_4$] method, this second interlayer insulating film 48 is selectively removed using photolithography and R1E technologies to form contact holes which expose the leader A1 wiring layer 42. Continuing, after forming A1 on the entire base substance, this A1 film undergoes patterning processing using photolithography and R1E technologies to form the spiral A1 wiring film 50a on the second interlayer insulating film 48 in the inductor formation region A. This is accompanied by the A1 terminal electrode 50b (for external connections) forming connected to the end of the inside of this spiral A1 wiring film 50a by way of the leader A1 wiring layer 42. Thus, the inductor 52 is completed comprised of the spiral A1 wiring film 50a, the leader A1 wiring layer 42 and the A1 terminal electrode 50b (for external connections) in the inductor formation region A. (Refer to FIG. 7.) In like manner to forming the above-mentioned leader A1 wiring layer 42, when forming this spiral A1 wiring film 50a simultaneously forming an A1 layer for connecting other elements in regions outside the inductor formation region naturally becomes possible.

Next, although it is not shown in the Figures, an overcoat film forms on the entire base substance and pad portions further open up at specified locations. Thus, a semiconductor integrated circuit is completed wherein the inductor is mixed mounted onto the same p type semiconductor substrate 10 together with a photo diode and bipolar transistor.

Next, the inductor 52 completed by the processes above will be described using FIGS. 8A and 8B. Namely, the spiral A1 wiring film 50a of the inductor 52 is connected to the A1 terminal electrode 50b (for external connections) by way of the leader A1 wiring layer 42 on the end of the inside. The end of the outside of the spiral A1 wiring film 50a functions as a terminal for external connections as is without any modifications. Because of this, the spiral A1 wiring film 50a of this inductor 52 can easily connect other elements. Further, this type of inductor 52 is formed on the p type semiconductor substrate 10 through the p– type high-resistance semiconductor layer 14a, the n type semiconductor layer 20a, the field oxidation film 22 and the first and second layer insulating films 40, 48. In other words, the pn joined p– type high-resistance semiconductor layer 14a and n type semiconductor layer 20a are disposed between the p type semiconductor substrate 10, the field oxidation film 22 and the first and second layer insulating films 40, 48.

According to the best mode as described above, in a semiconductor integrated circuit wherein the inductor 52 is mixed mounted onto the same p type semiconductor substrate 10 together with the PN photo diode 44 and the NPN bipolar transistor 46, not only is the p– type high-resistance semiconductor layer 14a disposed between the p type semiconductor substrate 10 under the spiral A1 wiring film 50a (that comprises the principal parts of the inductor 52), the field oxidation film 22 and the first and second layer insulating films 40, 48, a composition is also formed in which the n type semiconductor layer 20a that is pn joined with this p– type high-resistance semiconductor layer 14a is also disposed between them. Because of this, a capacitance formed from the field oxidation film 22 and the first and second layer insulating films is added between the inductor and the p type semiconductor substrate 10 and a comparatively small pn junction capacitance is added in series between the p– type high-resistance semiconductor layer 14a and the n type semiconductor layer 20a. This makes it possible to greatly reduce the overall parasitic capacitance compared to a conventional case and even at high frequencies the current flowing in the n type semiconductor layer 20a, the p– type high-resistance semiconductor layer 14a and the p type semiconductor substrate 10 is reduced thereby making it possible to control loss caused by this current. Furthermore, the p– type high-resistance semiconductor layer 14a under the spiral A1 wiring film 50a of the inductor 52 is simultaneously formed in the same process as the p– type anode layer 14b of the PN photo diode 44 and the n type semiconductor layer 20a is simultaneously formed in the same process as the n type cathode layer 20b of the PN photo diode 44 and the n type collector layer 20c of the NPN bipolar transistor 46. Because of this, it is not necessary to increase specialized and dedicated processes to form inductors. Therefore, a high performance inductor with favorable device characteristics that has a high Q value and high inductance can be realized without any reductions in productivity or increases in cost occur which also makes it possible to obtain semiconductor integrated circuits with even more features and higher performance.

Next, a modified example of the best mode will be described using FIGS. 9A and 9B. In the process shown in FIG. 5 of the above-mentioned best mode, when using the LOCOS method to selectively oxidize the n type epitaxial layer 20 to form the field oxidation film 22, if a method is utilized to remove a portion or all of the n type epitaxial layer 20 before forming the field oxidation film 22, the possibility that none of the n type epitaxial layer 20 will remain in the inductor formation region A has already been described before. This modified example is related to an inductor that has none of the layer remaining.

As shown in the plan view of FIG. 9A, the inductor 54 related to this modified example is identical to the example shown in FIG. 8A. As shown in FIG. 9B however, there is a difference in the cross section compared to the example shown in FIG. 8A above. The spiral A1 wiring film layer 50a of the inductor 52 is formed on the p type semiconductor substrate 10 by way of the p– type high-resistance semiconductor layer 14a, the field oxidation film 22 and the first and second layer insulating films 40, 48. In other words, only the p– type high-resistance semiconductor layer is disposed between the p type semiconductor substrate 10, the field oxidation film 22 and the first and second layer insulating films 40, 48.

Even for this case, a composition is formed wherein the p– type high-resistance semiconductor layer 14a is disposed between the p type semiconductor substrate 10 under the spiral A1 wiring film 50a (that comprises the principal parts of the inductor 54), the field oxidation film 22 and the first and second layer insulating films 40, 48. Consequently, even at high frequencies current flowing in the p– high-resistance semiconductor substrate 14a and the p type semiconductor substrate is reduced thereby making it possible to control loss caused by this current. In like manner to the best mode described above, it is not necessary to increase specialized and dedicated processes to form the inductor 54. Therefore, the same effects as the best mode described above can be obtained.

In the best mode described above, simultaneously forming the inductor 52 on the same p type semiconductor substrate 10 together with the n type cathode layer 20b of the PN photo diode 44 and the NPN bipolar transistor 46 was described, namely, when simultaneously forming the inductor 52 in a photo IC manufacturing process. Instead of, for example, this NPN bipolar transistor 46, a bipolar transistor with a different composition or a PNP bipolar transistor with a different polarity can be formed. A CMOS (Complementary Metal Oxide Semiconductor) transistor can also be formed.

The invention claimed is:

1. A semiconductor device, comprising:
   a first conductivity type substrate having an impurity concentration;
   a first conductivity type first semiconductor layer formed on said substrate and having an impurity concentration lower than the impurity concentration of said substrate;
   a second conductivity type second semiconductor layer formed on the first semiconductor layer;
   an insulating film formed on said second semiconductor layer;
   an inductor formed on said insulating film and having a conducting film defining a width of the inductor; and
   a bipolar transistor and a photo diode each being formed on the substrate,
   wherein said first semiconductor layer and second semiconductor layer are each formed under and at least as long as the width of said inductor,
   wherein said photo diode has an anode and a cathode, said first semiconductor layer is comprised of one of the anode and the cathode of said photo diode, and said second semiconductor layer is comprised of another of the anode and the cathode of said photo diode.

2. A semiconductor device, comprising:
   a first conductivity type substrate having an impurity concentration;
   a first conductivity type first semiconductor layer formed on said substrate and having an impurity concentration lower than the impurity concentration of said substrate;
   a second conductivity type second semiconductor layer formed on first semiconductor layer;
   an insulating film formed on said second semiconductor layer;
   an inductor formed on said insulating film and having a conducting film defining a width of the inductor; and
   a bipolar transistor and a photo diode each being formed on the substrate, wherein said first semiconductor layer and second semiconductor layer are each formed under and at least as long as the width of said inductor,
wherein said bipolar transistor has a collector and said second semiconductor layer is comprised of the collector of said bipolar transistor.

3. A semiconductor device, comprising:
a first conductivity type substrate having an impurity concentration;
an inductor formed over said substrate to define a first region having a width;
a photo diode formed over said substrate, said photo diode having an anode and a cathode;
a bipolar transistor formed over said substrate and having a collector;
a first conductivity type first semiconductor layer formed on said substrate and under said first region, to extend at least as long as said width of said first region, said first semiconductor layer having an impurity concentration lower than said impurity concentration of said substrate, said first semiconductor layer including one of the anode and the cathode of said photo diode;
a second conductivity type second semiconductor layer formed on said first semiconductor layer to extend at least as long as said width of said first region, said second semiconductor layer including another of the anode and the cathode of said photo diode and the collector of said bipolar transistor; and
an insulating film formed on said second semiconductor layer, wherein the inductor is formed on said insulating film.

4. A semiconductor device according to claim 3, wherein said second semiconductor layer is formed between said insulating film and said first semiconductor layer under the first region.

5. A semiconductor device according to claim 3, a region with an impurity concentration higher than said first semiconductor layer is formed under a second region of the semiconductor device which does not correspond to the first region defined by said inductor.

* * * * *